United States Patent
Lee et al.

(10) Patent No.: US 9,391,583 B2
(45) Date of Patent: Jul. 12, 2016

(54) TRANSMISSION LINE DRIVER CIRCUIT FOR AUTOMATICALLY CALIBRATING IMPEDANCE MATCHING

(71) Applicant: Realtek Semiconductor Corp., Hsinchu (TW)

(72) Inventors: Chao-Cheng Lee, Hsin-Chu (TW); Jian-Ru Lin, Nantou County (TW); Shih-Wei Wang, Hualien County (TW); Guan-Hong Ke, Shengang Township (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/842,305

(22) Filed: Sep. 1, 2015

(65) Prior Publication Data

US 2016/0094196 A1 Mar. 31, 2016

(30) Foreign Application Priority Data

Sep. 30, 2014 (TW) ................ 103133841 A

(51) Int. Cl.
  *H03F 1/56* (2006.01)
  *H03H 7/40* (2006.01)
  *H03F 3/45* (2006.01)
(52) U.S. Cl.
  CPC . *H03H 7/40* (2013.01); *H03F 1/56* (2013.01); *H03F 3/45* (2013.01)
(58) Field of Classification Search
  CPC .............. H03F 1/34; H03F 1/36; H03F 1/56; H03F 3/45; H03H 7/40
  USPC ................ 330/86, 252, 260; 326/26, 30
  See application file for complete search history.

(56) References Cited

U.S. PATENT DOCUMENTS

| 6,734,702 | B1 * | 5/2004 | Ikeoku ............... | H03K 19/0005 326/30 |
| 7,019,552 | B2 * | 3/2006 | Wang .................. | H03F 1/56 326/26 |
| 7,554,417 | B2 * | 6/2009 | Takagi ................ | H01L 23/647 333/17.3 |
| 7,888,962 | B1 * | 2/2011 | Om .................... | H03K 19/01742 326/30 |
| 2009/0009242 | A1 * | 1/2009 | Liao ................... | H03F 1/34 330/86 |

\* cited by examiner

*Primary Examiner* — Tung X Le
(74) *Attorney, Agent, or Firm* — Birch, Stewart, Kolasch & Birch, LLP

(57) ABSTRACT

A transmission line driver circuit includes: a transmission line driving amplifier having a first transmission terminal and a second transmission terminal; a first signal node; a second signal node; a first adjustable resistor positioned between the first transmission terminal and the first signal node; a second adjustable resistor positioned between the second transmission terminal and the second signal node; a first voltage difference generating circuit coupled with two terminals of the first adjustable resistor to generate a first voltage difference value; a second voltage difference generating circuit coupled with two terminals of the second adjustable resistor to generate a second voltage difference value; sample-and-hold circuits for generating sampled signals according to the first voltage difference value and the second voltage difference value; a comparing circuit for comparing the sampled signals; and an adjusting circuit for adjusting resistance of the first and/or second adjustable resistors according to the comparing result.

6 Claims, 1 Drawing Sheet

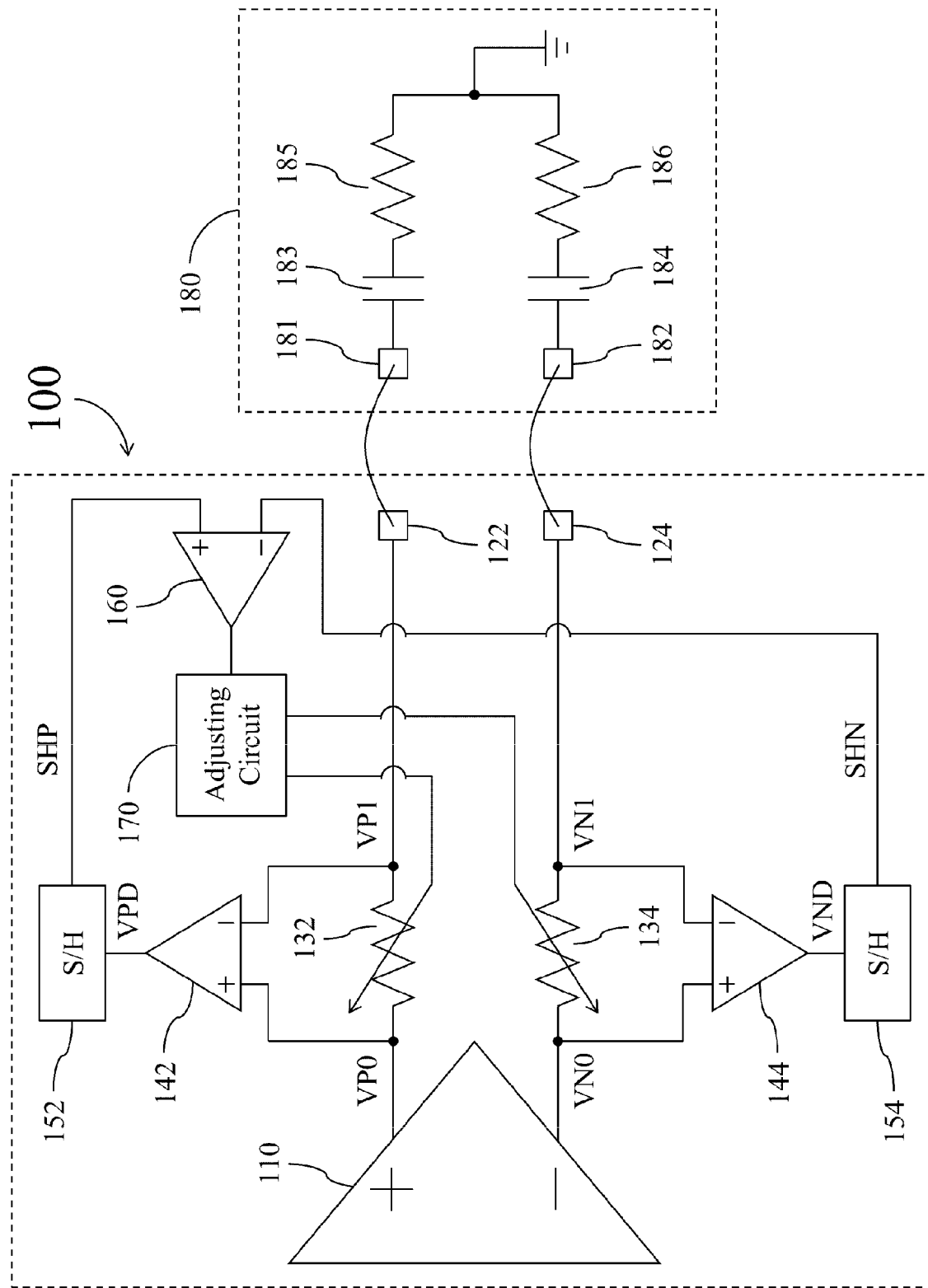

TRANSMISSION LINE DRIVER CIRCUIT FOR AUTOMATICALLY CALIBRATING IMPEDANCE MATCHING

CROSS-REFERENCE TO RELATED APPLICATIONS

This application claims the benefit of priority to Patent Application No. 103133841, filed in Taiwan on Sep. 30, 2014; the entirety of which is incorporated herein by reference for all purposes.

BACKGROUND

The disclosure generally relates to a transmission line driver circuit and, more particularly, to a transmission line driver circuit for automatically calibrating impedance matching.

In the ideal situation, an output circuit and an input circuit should operate under an impedance matching condition to efficiently deliver signals and energy. That is, the internal resistance of the output circuit should be identical to the input resistance of the output circuit, and the output impedance of the output circuit should be identical to the impedance of the input circuit (also refers to the load). A maximum transmission power can be achieved when the output circuit and the input circuit reach the impedance matching condition. On the contrary, if the output circuit and the input circuit cannot reach the impedance matching condition, it is impossible to maximize the transmission power and may also damage the circuits.

For example, when impedance mismatching occurs between the output circuit and the input circuit, it often results in asymmetry in the differential output currents of the output circuit, thereby causing EMI (electromagnetic interference) problems. In addition, the return loss is also increased when impedance mismatching occurs between the output circuit and the input circuit.

SUMMARY

In view of the foregoing, it may be appreciated that a substantial need exists for methods and apparatuses that mitigate or reduce the problems above.

An example embodiment of a transmission line driver circuit for automatically calibrating impedance matching is disclosed, comprising: a transmission line driving amplifier comprising a first transmission terminal and a second transmission terminal for providing a pair of differential transmission signals; a first signal node for coupling with a first load-end signal node of an equivalent load circuit; a second signal node for coupling with a second load-end signal node of the equivalent load circuit; a first adjustable resistor positioned on a signal path between the first transmission terminal and the first signal node; a second adjustable resistor positioned on a signal path between the second transmission terminal and the second signal node; a first signal difference generating circuit, coupled with two terminals of the first adjustable resistor, configured to operably generate a first voltage difference value; a second signal difference generating circuit, coupled with two terminals of the second adjustable resistor, configured to operably generate a second voltage difference value; a first sample-and-hold circuit, coupled with the first signal difference generating circuit, configured to operably conduct a sample-and-hold operation on the first voltage difference value to generate a first sampled signal; a second sample-and-hold circuit, coupled with the second signal difference generating circuit, configured to operably conduct a sample-and-hold operation on the second voltage difference value to generate a second sampled signal; a comparing circuit, coupled with the first sample-and-hold circuit and the second sample-and-hold circuit, configured to operably compare the first sampled signal with the second sampled signal; and an adjusting circuit, coupled with the first adjustable resistor, the second adjustable resistor, and the comparing circuit, configured to operably adjust resistance of at least one of the first adjustable resistor and the second adjustable resistor according to a comparing result of the comparing circuit.

Both the foregoing general description and the following detailed description are examples and explanatory only, and are not restrictive of the invention as claimed.

BRIEF DESCRIPTION OF THE DRAWINGS

FIG. 1 shows a simplified functional block diagram of a transmission line driver circuit according to one embodiment of the present disclosure.

DETAILED DESCRIPTION

Reference is made in detail to embodiments of the invention, which are illustrated in the accompanying drawings. The same reference numbers may be used throughout the drawings to refer to the same or like parts, components, or operations.

FIG. 1 shows a simplified functional block diagram of a transmission line driver circuit 100 according to one embodiment of the present disclosure. As shown in FIG. 1, the transmission line driver circuit 100 comprises a transmission line driving amplifier 110, a first signal node 122, a second signal node 124, a first adjustable resistor 132, a second adjustable resistor 134, a first signal difference generating circuit 142, a second signal difference generating circuit 144, a first sample-and-hold circuit 152, a second sample-and-hold circuit 154, a comparing circuit 160, and an adjusting circuit 170.

The transmission line driving amplifier 110 comprises a first transmission terminal and a second transmission terminal for providing a pair of differential transmission signals. In this embodiment, the first transmission terminal is the non-invert output (+) terminal of the transmission line driving amplifier 110 while the second transmission terminal is the invert output (−) terminal of the transmission line driving amplifier 110. The first signal node 122 is utilized for coupling with a first load-end signal node 181 of an equivalent load circuit 180. The second signal node 124 is utilized for coupling with a second load-end signal node 182 of the equivalent load circuit 180. In practice, the first signal node 122 and the second signal node 124 may be respectively coupled with the first load-end signal node 181 and the second load-end signal node 182 through various paired signal carrying lines. In operations, the first signal node 122 and the second signal node 124 respectively transmit the differential transmission signals generated by the transmission line driving amplifier 110 to the first load-end signal node 181 and the second load-end signal node 182 of the equivalent load circuit 180.

The term "equivalent load circuit" as used throughout the description and the claims refers to various input circuits, such as an amplifier, a circuit to be inspected, an antenna, a receiving circuit, etc. For simplicity of illustration, the functional blocks of the equivalent load circuit 180 are simplified in FIG. 1. In the equivalent load circuit 180, the load-end equivalent capacitor 183 is utilized to represent an equivalent capacitor of the signal path on which the first load-end signal node 181 resides, and the load-end equivalent impedance 185 is utilized to represent an equivalent impedance of the signal path on which the first load-end signal node 181 resides. Similarly, the load-end equivalent capacitor 184 is utilized to represent an equivalent capacitor of the signal path on which the second load-end signal node 182 resides, and the load-end equivalent impedance 186 is utilized to represent an equivalent impedance of the signal path on which the second load-end signal node 182 resides.

In addition, the aforementioned first signal node 122 and second signal node 124 may be a pair of differential signal nodes of a medium dependent interface (MDI), a pair of differential signal node of a medium dependent interface crossover (MDIX), or a pair of differential signal nodes of other signal transmission interface. Similarly, the aforementioned first load-end signal node 181 and second load-end signal node 182 may be a pair of differential signal nodes of a MDI, a pair of differential signal node of a MDIX, or a pair of differential signal nodes of other signal transmission interface.

In this embodiment, a first terminal of the first adjustable resistor 132 is coupled with the first transmission terminal of the transmission line driving amplifier 110 and a non-invert input (+) terminal of the first signal difference generating circuit 142, while a second terminal of the first adjustable resistor 132 is coupled with the first signal node 122 and an invert input (−) terminal of the first signal difference generating circuit 142. A first terminal of the second adjustable resistor 134 is coupled with the second transmission terminal of the transmission line driving amplifier 110 and a non-invert input (+) terminal of the second signal difference generating circuit 144, while a second terminal of the second adjustable resistor 134 is coupled with the second signal node 124 and an invert input (−) terminal of the second signal difference generating circuit 144.

In other words, in the transmission line driver circuit 100, the first adjustable resistor 132 is positioned on the signal path between the first transmission terminal and the first signal node 122, the second adjustable resistor 134 is positioned on the signal path between the second transmission terminal and the second signal node 124, the first signal difference generating circuit 142 is coupled with the two terminals of the first adjustable resistor 132, and the second signal difference generating circuit 144 is coupled with the two terminals of the second adjustable resistor 134.

The first signal difference generating circuit 142 is configured to operably generate a first voltage difference value VPD, and the second signal difference generating circuit 144 is configured to operably generate a second voltage difference value VND. In this embodiment, the first signal difference generating circuit 142 calculates a voltage difference between a voltage VP0 at the first terminal of the first adjustable resistor 132 and a voltage VP1 at the second terminal of the first adjustable resistor 132 to generate the first voltage difference value VPD. The second signal difference generating circuit 144 calculates a voltage difference between a voltage VN0 at the first terminal of the second adjustable resistor 134 and a voltage VN1 at the second terminal of the second adjustable resistor 134 to generate the second voltage difference value VND. Accordingly, the first voltage difference value VPD may be utilized to represent the voltage difference across the two terminals of the first adjustable resistor 132, and the second voltage difference value VND may be utilized to represent the voltage difference across the two terminals of the second adjustable resistor 134.

The first sample-and-hold circuit 152 is coupled with the first signal difference generating circuit 142 and configured to operably conduct a sample-and-hold operation on the first voltage difference value VPD to generate a first sampled signal SHP according to the first voltage difference value VPD. The second sample-and-hold circuit 154 is coupled with the second signal difference generating circuit 144 and configured to operably conduct a sample-and-hold operation on the second voltage difference value VND to generate a second sampled signal SHN according to the second voltage difference value VND.

The comparing circuit 160 is coupled with the output terminals of the first sample-and-hold circuit 152 and the second sample-and-hold circuit 154. The comparing circuit 160 is configured to operably compare the first sampled signal SHP with the second sampled signal SHN. In this embodiment, a non-invert input (+) terminal of the comparing circuit 160 is coupled with the output terminal of the first sample-and-hold circuit 152, and an invert input (−) terminal of the comparing circuit 160 is coupled with the output terminal of the second sample-and-hold circuit 154.

The adjusting circuit 170 is coupled with the first adjustable resistor 132, the second adjustable resistor 134, and the comparing circuit 160. The adjusting circuit 170 is configured to operably adjust the resistance of at least one of the first adjustable resistor 132 and the second adjustable resistor 134 according to a comparing result of the comparing circuit 160.

In practice, the adjusting circuit 170 may be realized with various logic circuits, digital circuits, counters, or a combination of the above circuits. In some embodiments, the adjusting circuit 170 may further comprise a storage circuit (not shown) for storing data, and the storage circuit may be registers, buffers, flip-flops, memories, etc.

In the ideal situation, when the transmission line driver circuit 100 and the equivalent load circuit 180 reach the impedance matching condition, the voltage difference between the voltages VP0 and VP1 at the two terminals of the first adjustable resistor 132 should be identical to the voltage difference between the voltages VN0 and VN1 at the two terminals of the second adjustable resistor 134, and thus the magnitude of the first sampled signal SHP and the magnitude of the second sampled signal SHN should be identical.

Accordingly, when the output of the comparing circuit 160 shows that the first sampled signal SHP is not identical to the second sampled signal SHN, the adjusting circuit 170 determines that impedance mismatching occurs between the transmission line driver circuit 100 and the equivalent load circuit 180. In this situation, the adjusting circuit 170 may calibrate the output impedance of the transmission line driver circuit 100 by adjusting the resistance of at least one of the first adjustable resistor 132 and the second adjustable resistor 134 to thereby cause the transmission line driver circuit 100 and the equivalent load circuit 180 to reach the impedance matching condition.

For example, when the comparing circuit 160 determines that the first sampled signal SHP is greater than the second sampled signal SHN, the adjusting circuit 170 may reduce the resistance of the first adjustable resistor 132 or increase the resistance of the second adjustable resistor 134. On the contrary, when the comparing circuit 160 determines that the first sampled signal SHP is less than the second sampled signal SHN, the adjusting circuit 170 may increase the resistance of the first adjustable resistor 132 or reduce the resistance of the second adjustable resistor 134.

In some embodiments where the output of the comparing circuit 160 could only indicate the magnitude relationship between the first sampled signal SHP and the second sampled signal SHN, when the comparing circuit 160 determines that the first sampled signal SHP is greater than the second sampled signal SHN, the adjusting circuit 170 may gradually reduce the resistance of the first adjustable resistor 132 or increase the resistance of the second adjustable resistor 134 in multiple calibration cycles until the output polarity of the comparing circuit 160 is changed.

In some embodiment where the output of the comparing circuit 160 could show both the magnitude relationship between the first sampled signal SHP and the second sampled signal SHN and the difference between the first sampled signal SHP and the second sampled signal SHN, when the comparing circuit 160 determines that the first sampled signal SHP is greater than the second sampled signal SHN, the adjusting circuit 170 may directly reduce the resistance of the first adjustable resistor 132 to a first target value or directly increase the resistance of the second adjustable resistor 134 to a second target value in a single calibration cycle. For example, a mapping relationship between the resistance adjustment and the difference between the first sampled signal SHP and the second sampled signal SHN may be represented in the form of a look-up table and pre-recorded in the storage circuit of the adjusting circuit 170. In operations, the adjusting circuit 170 may obtain an adequate resistance adjustment from the look-up table according to the difference between the first sampled signal SHP and the second sampled signal SHN, and then adjust the resistance of at least one of the first adjustable resistor 132 and the second adjustable resistor 134 accordingly.

In can be appreciated from the foregoing descriptions that the comparing circuit 160 in the transmission line driver circuit 100 is capable of detecting whether the transmission line driver circuit 100 and the equivalent load circuit 180 reach the impedance matching condition. If the comparing result of the comparing circuit 160 shows that impedance mismatching occurs between the transmission line driver circuit 100 and the equivalent load circuit 180, the adjusting circuit 170 calibrates the output impedance of the transmission line driver circuit 100 by adjusting the resistance of at least one of the first adjustable resistor 132 and the second adjustable resistor 134. As a result, the impedance mismatching between the transmission line driver circuit 100 and the equivalent load circuit 180 could be automatically and effectively calibrated, thereby rendering the transmission line driver circuit 100 and the equivalent load circuit 180 to reach the impedance matching condition.

The foregoing operations conducted by the adjusting circuit 170 to adjust the resistance of at least one of the first adjustable resistor 132 and the second adjustable resistor 134 based on the comparing result of the comparing circuit 160 could also mitigate or eliminate the asymmetry in the differential output currents between the first signal node 122 and the second signal node 124. Therefore, the EMI (electromagnetic interference) problems and return loss could be effectively reduced.

In addition, the structure of the aforementioned transmission line driver circuit 100 is applicable to various output circuits, and thus could be applied in many applications.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A transmission line driver circuit for automatically calibrating impedance matching, comprising:
    a transmission line driving amplifier comprising a first transmission terminal and a second transmission terminal for providing a pair of differential transmission signals;
    a first signal node for coupling with a first load-end signal node of an equivalent load circuit;
    a second signal node for coupling with a second load-end signal node of the equivalent load circuit;
    a first adjustable resistor positioned on a signal path between the first transmission terminal and the first signal node;
    a second adjustable resistor positioned on a signal path between the second transmission terminal and the second signal node;
    a first signal difference generating circuit, coupled with two terminals of the first adjustable resistor, configured to operably generate a first voltage difference value;
    a second signal difference generating circuit, coupled with two terminals of the second adjustable resistor, configured to operably generate a second voltage difference value;
    a first sample-and-hold circuit, coupled with the first signal difference generating circuit, configured to operably conduct a sample-and-hold operation on the first voltage difference value to generate a first sampled signal;
    a second sample-and-hold circuit, coupled with the second signal difference generating circuit, configured to operably conduct a sample-and-hold operation on the second voltage difference value to generate a second sampled signal;
    a comparing circuit, coupled with the first sample-and-hold circuit and the second sample-and-hold circuit, configured to operably compare the first sampled signal with the second sampled signal; and
    an adjusting circuit, coupled with the first adjustable resistor, the second adjustable resistor, and the comparing circuit, configured to operably adjust resistance of at least one of the first adjustable resistor and the second adjustable resistor according to a comparing result of the comparing circuit.

2. The transmission line driver circuit of claim 1, wherein when the comparing circuit determines that the first sampled signal is greater than the second sampled signal, the adjusting circuit reduces a resistance of the first adjustable resistor or increases a resistance of the second adjustable resistor.

3. The transmission line driver circuit of claim 2, wherein the adjusting circuit gradually reduces the resistance of the first adjustable resistor or increase the resistance of the second adjustable resistor in multiple calibration cycles until an output polarity of the comparing circuit is changed.

4. The transmission line driver circuit of claim 2, wherein the adjusting circuit directly reduces the resistance of the first adjustable resistor to a first target value or directly increases the resistance of the second adjustable resistor to a second target value in a single calibration cycle.

5. The transmission line driver circuit of claim 1, wherein the first signal node and the second signal node are a pair of differential signal nodes of a medium dependent interface (MDI).

6. The transmission line driver circuit of claim 1, wherein the first signal node and the second signal node are a pair of differential signal node of a medium dependent interface crossover (MDIX).

* * * * *